(12) United States Patent
Genies et al.

(10) Patent No.: US 9,673,650 B2
(45) Date of Patent: Jun. 6, 2017

(54) METHOD FOR MONITORING A LI-ION BATTERY AND MONITORING DEVICE FOR THE IMPLEMENTATION THEREOF (75) Inventors: Sylvie Genies, Saint-Egreve (FR);
David Brun-Buisson, Vatilieu (FR);
Nina Kircheva, Aix les Bains (FR);
Pierre-Xavier Thivel, Grenoble (FR)

(73) Assignees: COMMISSARIAT A L'ENERGIE ATOMIQUE ET AUX ENERGIES ALTERNATIVES, Paris (FR);
UNIVERSITE JOSEPH FOURIER-GRENOBLE, Grenoble (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 337 days.

(21) Appl. No.: 14/114,573

(22) PCT Filed: Apr. 27, 2012

(86) PCT No.: PCT/EP2012/057736
§ 371 (c)(1),
(2), (4) Date: Feb. 25, 2014

(87) PCT Pub. No.: WO2012/146704
PCT Pub. Date: Nov. 1, 2012

(65) Prior Publication Data
US 2014/0159674 A1      Jun. 12, 2014

(30) Foreign Application Priority Data

Apr. 29, 2011   (FR) ...................................... 11 53663

(51) Int. Cl.
*H02J 7/00*   (2006.01)
*H01M 10/0525*   (2010.01)
(Continued)

(52) U.S. Cl.
CPC ........ *H02J 7/0052* (2013.01); *G01R 31/3606* (2013.01); *H01M 10/0525* (2013.01);
(Continued)

(58) Field of Classification Search
None
See application file for complete search history.

(56) References Cited

U.S. PATENT DOCUMENTS 6,114,188 A  *  9/2000  Oliver ..................... C04B 41/81
                                                        257/E21.122
7,235,334 B2     6/2007  Kim et al.
(Continued)

FOREIGN PATENT DOCUMENTS

CN          1722509 A       1/2006
CN        101079509 A      11/2007
(Continued)

OTHER PUBLICATIONS

Holzapfel et al., "First lithiation and charge/discharge cycles of graphite materials, investigated by electrochemical impedance spectroscopy," Journal of Electroanalytical Chemistry 546 (2003), pp. 41-50.*
(Continued)

*Primary Examiner* — Leigh Garbowski
(74) *Attorney, Agent, or Firm* — Haug Partners LLP (57) ABSTRACT

Method for monitoring an electrochemical cell or a battery (1), in particular method for monitoring the first charging of an electrochemical cell or of a battery (1) of Li-ion type, comprising a step of acquiring data relating to acoustic emissions produced in the electrochemical cell or in the battery and, by using the data acquired, a step of detecting:
  the formation of a passivation film on an electrode of the electrochemical cell or of the battery; and/or
(Continued)

the first storage of lithium in an electrode of the electrochemical cell or of the battery.

21 Claims, 6 Drawing Sheets (51) Int. Cl.
| | |
|---|---|
| *H01M 10/44* | (2006.01) |
| *H01M 10/48* | (2006.01) |
| *G01R 31/36* | (2006.01) |
| *H01M 2/32* | (2006.01) |

(52) U.S. Cl.
CPC ......... *H01M 10/44* (2013.01); *H01M 10/446* (2013.01); *H01M 10/48* (2013.01); *H01M 2/32* (2013.01); *H02J 7/007* (2013.01); *H02J 7/0021* (2013.01); *H02J 7/0088* (2013.01); *Y02P 70/54* (2015.11); *Y10T 29/49108* (2015.01)

(56) References Cited

U.S. PATENT DOCUMENTS

| | | | |
|---|---|---|---|
| RE43,724 E | | 10/2012 | Kim et al. |
| 8,549,927 B2 * | | 10/2013 | Hojo ................... G01R 31/3627 73/788 |
| 2005/0287442 A1 | | 12/2005 | Kim et al. |

FOREIGN PATENT DOCUMENTS

| | | | | |
|---|---|---|---|---|
| CN | 101286578 A | | 10/2008 | |
| CN | 101330158 A | | 12/2008 | |
| FR | 2949908 | * | 3/2011 | ............ H01M 10/48 |
| FR | 2949908 A | | 3/2011 | |
| JP | H076795 | * | 1/1995 | ............ H01M 10/48 |
| JP | 2002-208440 | | 7/2002 | |
| JP | PCT/JP2009/003065 | * | 7/2009 | ............... G01N 3/00 |

OTHER PUBLICATIONS

Jirarungsatian et al., "Pitting and uniform corrosion source recognition using acoustic emission parameters," Corrosion Science 52 (2010), pp. 187-197.*
Komagata et al., "Detection of Degradation of Lithium0ion Batteries with Acoustic Emission Technique," 2010 ECS Transactions, 25 (33), pp. 163-167.*
Levi et al., "Simultaneous Measurements and Modeling of the Electrochemical Impedance and the Cyclic Voltammetric Characteristics of Graphite Electrodes Doped with Lithium," J. Phys. Chem. B (1997), 101, pp. 4630-4640.*
Ohzuku et al., "Monitoring of Particle Fracture by Acoustic Emission during Charge and Discharge of Li/MnO2 Cells," J. Electrochem. Soc., vol. 144, No. 10, Oct. 1997, pp. 3496-3500.*
Verma et al., "A review of the features and analyses of the solid electrolyte interphase in Li-ion batteries," Electrochimica Acta 55 (2010), pp. 6332-6341.*
Villevieille et al., "Direct evidence of morphological changes in conversion type electrodes in Li-ion battery by acoustic emission," Electrochemistry Communications 12 (2010), pp. 1336-1339.*
Winter et al., "Insertion Electrode Materials for Rechargeable Lithium Batteries," Advanced Materials, 1998, 10, No. 10, pp. 725-763.*
Notification of the First Office Action from the Chinese Patent Office for corresponding Chinese application 201280021296.4 dated Jun. 3, 2015, English translation.
Notification of the Second Office Action from the Chinese Patent Office (SIPO) for corresponding Chinese Application 201280021296.4 mailed Feb. 6, 2016, English translation.
Notice of Reasons for Rejection from Japanese Patent Office for corresponding Japanese Application 2014-506884 mailed Jan. 5, 2016, English translation.

* cited by examiner

FIG.1

RELATED ART

FIG.2

RELATED ART

METHOD FOR MONITORING A LI-ION BATTERY AND MONITORING DEVICE FOR THE IMPLEMENTATION THEREOF

This application is a 371 of PCT/EP2012/057736 filed on Apr. 27, 2012, published on Nov. 1, 2012 under publication number WO 2012/146704, which claims priority benefits from French Patent Application Number 1153663 filed Apr. 29, 2011, the disclosure of which is incorporated herein by reference.

The present invention relates to the field of storage batteries of lithium-ion or Li-ion type. In particular, the invention relates to a method for monitoring an electrochemical cell or a battery. The invention also relates to a charging method comprising an implementation of such a monitoring method. The invention also relates to a method for manufacturing a battery comprising an implementation of such a charging method. The invention also relates to a battery obtained by the implementation of such a manufacturing method. The invention further relates to a monitoring device that implements the monitoring method. The invention finally relates to a charging system comprising such a monitoring device.

Figure 1:
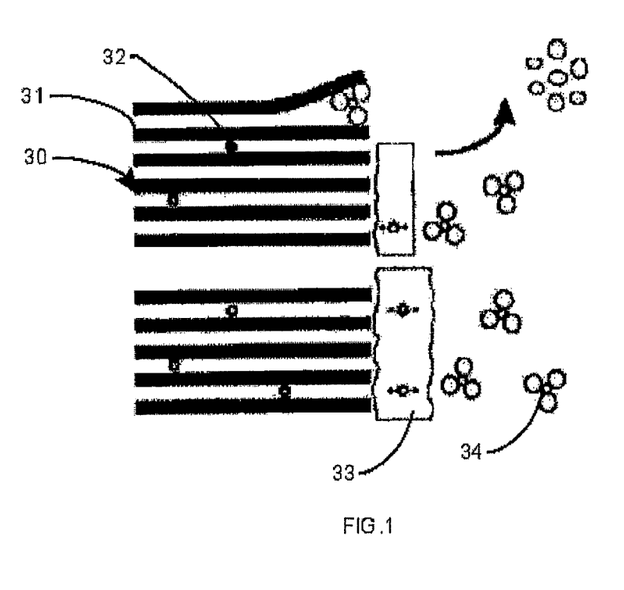
FIG. 1 is a diagram representing the principle for formation of the passivation film and storage of the lithium in a graphite electrode.

As represented in FIG. 1, in the electrochemical cells used in Li-ion type batteries, use is made of a graphite electrode 30, in particular a negative graphite electrode. In this electrode, during the first electrochemical reaction, in particular the first charging, formation of a passivation film or layer 33 occurs. This film is produced by the decomposition, during the first charging of the cell, of products 34 contained in the electrolyte comprising organic products and lithium salt. This decomposition enables the production of the film which prevents the lithium ions associated with a solvent from penetrating into the electrode. This film is referred to as a solid-electrolyte interface or "SEI" by analogy with the passivation layer that may be formed at the surface of the solid lithium. This film is very important for the future operation of the battery since it makes it possible to protect the electrode from certain reactions. Specifically, thanks to this film which has an electronic insulator and ionic conductor property, it is possible to reversibly store and withdraw lithium ions 32 without substantially increasing the distances between the various graphite strata or layers 31 of the electrode. The lithium is then stored between the graphite strata or layers. Thus, the structure of the graphite electrode is preserved over time and this structure is dimensionally stable enough to grant the battery a long service life. Thus, the battery is provided with the maximum capacity.

Figure 2:
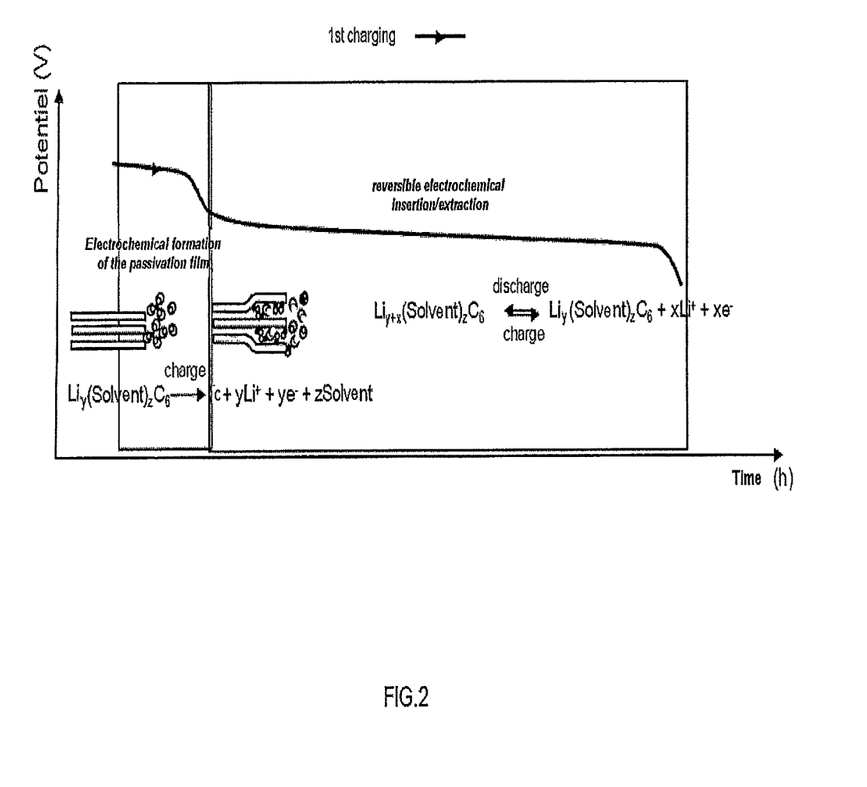
FIG. 2 is a graph of the change in the potential of a lithium electrochemical half-cell over time.

This phenomenon of formation of the film occurs during the first charging of the electrochemical cell. It is represented in the diagram of FIG. 2.

This phenomenon is studied in a known manner by testing a graphite-lithium half-cell. In this particular configuration of cells, the positive electrode is made of graphite and the negative electrode is a lithium metal foil. Thus, the first storage of lithium in the graphite is carried out during the first discharging of the electrochemical half-cell, whereas the same phenomenon occurs during the charging of the complete cell. The phenomenon is in this way observed more easily since a hold is visible on the voltage profile of the cell during the discharging thereof, this hold corresponding to an electrochemical reduction of $Li_xC_6$ for a potential of 0.8 V of the $Li^+/Li$ pair at a higher voltage where the lithium is stored in the graphite. FIG. 2 represents the voltage profile for discharging a graphite-lithium half-cell. The hold for forming the SEI film is clearly visible during the first discharge for a potential of 0.8 V of the $Li^+/Li$ electrochemical pair. This hold is only visible during the first discharge and is no longer present during the subsequent discharges. Indeed, the SEI film is mainly formed during the first phase of storing the lithium ions in the graphite. This first phase is therefore the most important and must be correctly controlled in order to produce the best possible SEI film, especially as regards its thickness, its uniformity, its surface finish and its area. This is why it is customary to carry out the first charging at a constant and low-intensity current.

This inflection is not discernible for a complete cell. In practice, in commercial batteries, the first charging of the battery is carried out by the manufacturers before the latter sell it. Conventionally, this charging is carried out by application of a constant current until the battery reaches a voltage threshold. It is a galvanostatic charging. As seen above, it is important to note that the hold mentioned above and corresponding to the phase of producing the SEI film is not visible on the voltage profile of the first charging of the battery.

The objective of the invention is to provide a monitoring method that makes it possible to overcome the problems mentioned above and that improves the monitoring methods known from the prior art. In particular, the invention provides a method for monitoring a battery that is simple, non-intrusive and inexpensive. The monitoring method additionally enables the manufacture of an optimized battery, the manufacturing quality being ensured while limiting the manufacturing time.

The method according to the invention makes it possible to monitor an electrochemical cell or a battery, in particular the first charging of an electrochemical cell or of a battery of Li-ion type. The method comprises a step of acquiring data relating to acoustic emissions produced in the electrochemical cell or in the battery and, by using the data acquired, a step of detecting:
 the formation of a passivation film on an electrode of the electrochemical cell or of the battery; and/or
 the first storage of lithium in an electrode of the electrochemical cell or of the battery.

The detection step may be based on the characterization of the acoustic emissions.

The characterization of the acoustic emissions may be based on the analysis of a combination of one or more of the following parameters relating to the acoustic emissions:
 number of acoustic events; and/or
 amplitude of an acoustic event; and/or
 energy of an acoustic event; and/or
 rise or rise time of an acoustic event; and/or
 frequency of acoustic events; and/or
 duration of an acoustic event.

The formation of a passivation film on an electrode of the electrochemical cell or of the battery and/or the first storage of lithium in an electrode of the electrochemical cell or of the battery can be considered to be detected when the value of one of the parameters relating to the acoustic emissions exceeds a predetermined threshold or when the value of the derivative of one of the parameters relating to the acoustic emissions exceeds a predetermined threshold.

The formation of a passivation film on an electrode of the electrochemical cell or of the battery or the first storage of lithium in an electrode of the electrochemical cell or of the battery can be considered to be detected or in the process of being carried out when the value of at least one of the parameters relating to the acoustic emissions passes a predetermined threshold.

The end of the formation of a passivation film on an electrode of the electrochemical cell or of the battery and/or the end of the first storage of lithium in an electrode of the electrochemical cell or of the battery can be considered to be detected when the value of one of the parameters relating to the acoustic emissions passes a predetermined threshold or when the value of the derivative of one of the parameters relating to the acoustic emissions passes a predetermined threshold.

The method according to the invention makes it possible to charge an electrochemical cell or a battery, in particular an electrochemical cell or a battery of Li-ion type. The method comprises a step of monitoring the electrochemical cell or the battery, for example a step of implementing the monitoring method defined previously, and a step of operating a device for the electrical charging of the electrochemical cell or of the battery, the operation of the charging device being dependent on the detection or absence of detection:

of the formation of a passivation film on an electrode of the electrochemical cell or of the battery; and/or of the first storage of lithium in an electrode of the electrochemical cell or of the battery.

It is possible to charge the electrochemical cell or the battery with a first charging current before detecting the formation of a passivation film on an electrode of the electrochemical cell or of the battery and/or before detecting the first storage of lithium in an electrode and it is possible to charge the electrochemical cell or the battery with a second charging current when the formation of a passivation film on an electrode of the electrochemical cell or of the battery is detected and/or when the first storage of lithium in an electrode is detected.

The mean intensity of the second current may be lower than the mean intensity of the first current, in particular the intensity of the second current is less than 75% of the intensity of the first current, or even less than 50% of the intensity of the first current.

It is possible to charge the electrochemical cell or the battery with a third charging current when the formation of a passivation film on an electrode of the electrochemical cell or of the battery is no longer detected and/or when the first storage of lithium in an electrode is no longer detected.

The mean intensity of the second current may be lower than the mean intensity of the third current, in particular the intensity of the second current is less than 75% of the intensity of the third current, or even less than 50% of the intensity of the third current.

The intensity of the third current may be equal to or may be substantially equal to the intensity of the first current.

The method according to the invention makes it possible to manufacture an electrochemical cell or a battery, in particular an electrochemical cell or a battery of Li-ion type. The method comprises a step of implementing the charging method defined above.

According to the invention, an electrochemical cell or battery is obtained by implementing the manufacturing method defined above.

According to the invention, a device for monitoring an electrochemical cell or a battery, in particular a device for monitoring the first charging of an electrochemical cell or of a battery of Li-ion type, comprises hardware components and/or software components for implementing the monitoring method defined above.

The hardware components and/or software components may comprise a component for acquiring data relating to acoustic emissions produced in the electrochemical cell or in the battery and a component for detecting:

the formation of a passivation film on an electrode of the electrochemical cell or of the battery; and/or the first storage of lithium in an electrode.

According to the invention, a system for charging an electrochemical cell or a battery, in particular a system for the first charging of an electrochemical cell or of a battery of Li-ion type, comprises a monitoring device defined above and a charging device, the charging device being controlled as a function of information provided by the monitoring device.

The appended drawings represent, by way of example, an embodiment of a monitoring device according to the invention.

Figure 3:
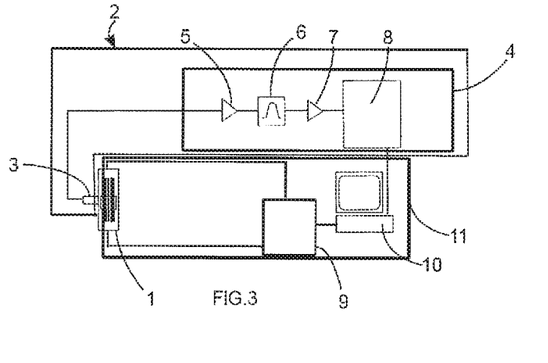
FIG. 3 is a diagram of an embodiment of a system for the electrical charging of an electrochemical cell or of a battery according to the invention.

One embodiment of a device 2 for monitoring the charging of an electrochemical cell or of a battery 1 is described below with reference to FIG. 3. This monitoring device is intended to monitor the charging of an electrochemical cell or of a battery of Li-ion type. The monitoring device is based on the detection and characterization of acoustic emissions produced in the electrochemical cell or in the battery during charging, in particular during the first charging. For this purpose, the monitoring device comprises mainly a sensor 3 and a device 4 for processing the signals produced as output from the acoustic sensor 3. It may be advantageous to use several sensors in order to reliabilize the detection and/or in order to distribute them in order to provide a spatial monitoring.

The sensor 3 is intended to detect the acoustic emissions produced within the electrochemical cell or within the battery 1 and transform them or convert them into a signal, in particular into an electrical signal. For this purpose, the sensor is preferably positioned as close as possible to the site of production of the acoustic emissions. For example, the sensor may be positioned in the vicinity of the battery or of the cell. In particular, it is advantageous to position the sensor at a wall of the cell or of the battery, for example on one face of the cell or of the battery. Thus, the acoustic emissions may arrive at the sensor by only passing through the components of the cell or of the battery. The sensor may therefore be attached to the cell or to the battery. The sensor may be of acoustic type or of another type, such as an accelerometer, the important thing being that it can detect the acoustic emissions produced in the cell or the battery and transform them into a signal which can be analysed. The sensor may be of piezoelectric type. In particular, the sensor makes it possible to detect and transform acoustic emissions, the frequency of which is between 1 kHz and 3 MHz, in particular between 50 kHz and 1.5 MHz.

The signal obtained as output from the sensor is a function of the phenomenon that generates the acoustic emissions, of the transmission of the acoustic emissions in the cell or in the battery to the sensor and of the transformation of the signal by the sensor into an output signal.

The output signal of the sensor or the signal produced by the sensor then strikes a signal processing component 4. For example, this signal processing component comprises a preamplifier 5 and/or a filter 6, in particular a low-pass filter and/or a band-pass filter and/or a high-pass filter and/or an amplifier 7 and/or a component for formatting and/or detecting events.

This processing component makes it possible to characterize the acoustic emissions detected in the cell or in the battery and to deduce therefrom what is occurring, especially to deduce whether an SEI film is in the process of being formed on a negative electrode, in particular a negative electrode made of graphite. The processing component also makes it possible to deduce whether lithium is in the process of being stored for the first time in the graphite of the negative electrode. Of course, this processing component comprises, in order to do this, a component for analysing the signal that strikes the processing component and provided, for example, by the amplifier 7. Furthermore, the processing component uses values of parameters, such as thresholds, that make it possible to define conditions under which a given event, such as the formation of the SEI film and/or the first storage of lithium in the negative electrode, is observed.

Once an event is detected, the monitoring device 2, in particular the processing component, transmits information conveying the existence of this event to a device 11 for charging the electrochemical cell or the battery. The information is in particular transmitted to a control unit of the charging device. The control unit 10 may for example comprise a computer or a calculator. In particular, the control unit 10 controls a charger 9 that makes it possible to charge the electrochemical cell or the battery with an electric current. Such a charger advantageously comprises a charging current generator. The control unit makes it possible to control the charger 9 as a function of the events detected by the monitoring device 2.

The monitoring device comprises all the hardware components and/or software components that make it possible to implement the monitoring method that is the subject of the invention. In particular, it comprises a component 3 for acquiring data relating to acoustic emissions produced in the electrochemical cell or in the battery and a component 4, 8 for detecting:

the formation of a passivation film on an electrode of the electrochemical cell or of the battery; and/or
the first storage of lithium in an electrode.

One part of the acquisition component may comprise software means. Similarly, all or part of the detection component may comprise software means.

A first embodiment of a method for monitoring an electrochemical cell or a battery 1 according to the invention is described below. It makes it possible in particular to monitor the first charging of an electrochemical cell or of a battery of Li-ion type.

In a first step, data relating to acoustic emissions produced in the electrochemical cell or in the battery is acquired or received. This acquisition is for example carried out by means of the acquisition component 3 that may comprise a sensor as mentioned previously. During the operation of an electrochemical cell or of a battery, in particular during the first charging of an electrochemical cell or of a battery, chemical and/or physical phenomena, in particular chemical reactions, occur. During the formation of the SEI film, a precipitation of solid products and a gas evolution at the surface of the graphite electrode occur in particular. These phenomena generate acoustic emissions. These acoustic emissions lie in the audible range and in the ultrasound range. At least some of these acoustic emissions are characteristic of the chemical and/or physical phenomenon that occurs. This acquisition takes place via an acquisition component as described above which produces a signal, in particular an electrical signal, representative of the acoustic emissions. This signal comprises the acoustic data. The signal is then formatted, in particular amplified and/or filtered before being analysed in an analysis component included in the detection component.

Thus, once the acoustic data is acquired or received, it is analysed or processed in the detection component in order to determine or detect what event or phenomenon is in the process of taking place in the cell or in the battery and, in particular, in order to determine or detect whether a particular phenomenon, such as formation of a passivation film on an electrode of the electrochemical cell or of the battery and/or a first storage of lithium in an electrode of the electrochemical cell or of the battery, is in the process of occurring in the electrochemical cell or the battery.

Thus, the data acquired is used in order to detect:
the formation of a passivation film on an electrode of the electrochemical cell or of the battery; and/or
the first storage of lithium in an electrode of the electrochemical cell or of the battery.

Figure 4:
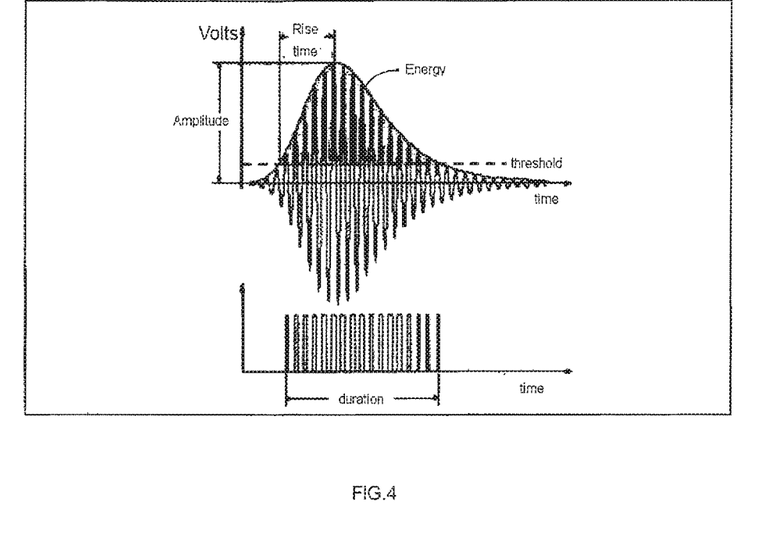
FIG. 4 is a graph illustrating various parameters that make it possible to characterize an acoustic emission.

The analysis, and therefore the detection, is based on the characterization of the acoustic emissions. Thus, preferably, a combination of one or more of the following parameters relating to the acoustic emissions is analysed:
number of acoustic events; and/or
amplitude of an acoustic event; and/or
energy of an acoustic event; and/or
rise or rise time of an acoustic event; and/or
frequency of acoustic events; and/or
duration of an acoustic event, in order to characterize the acoustic emissions and deduce therefrom the existence or absence of a particular phenomenon. These various parameters are represented on the graph of FIG. 4 which represents an acoustic emission or an event. It should be noted that two types of frequencies may be used to characterize the emissions: the frequency of occurrence of the acoustic emission and the frequency of the peaks or oscillations that make up the emission.

Preferably, it is considered that the formation of a passivation film on an electrode of the electrochemical cell or of the battery or the first storage of lithium in an electrode of the electrochemical cell or of the battery is detected or is in the process of being carried out when the value of at least one of the parameters relating to the acoustic emissions passes a predetermined threshold. One or more thresholds must therefore be recorded beforehand in the detection component in order to enable the characterization. Preferably, an amplitude threshold (represented in FIG. 4) is used to enable the definition of certain parameters such as the rise or the duration, these parameters only being measured when the amplitude of the acoustic emission is above the threshold.

Figure 6:
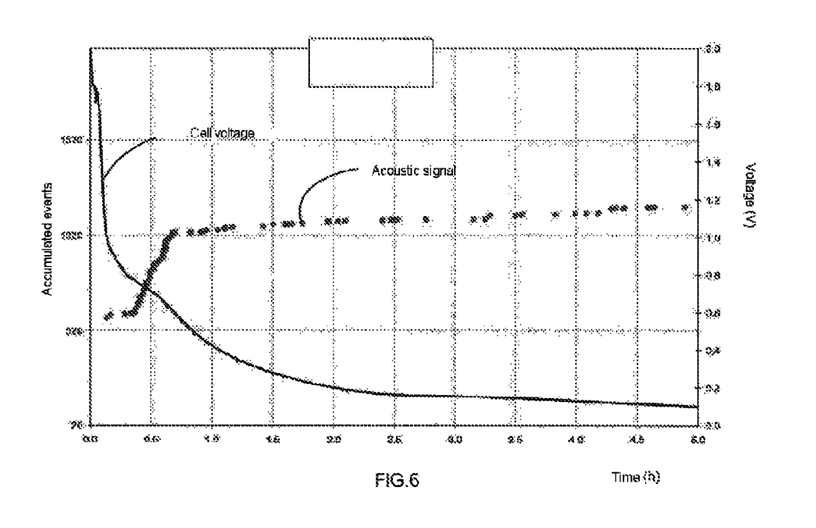
Figure 7:
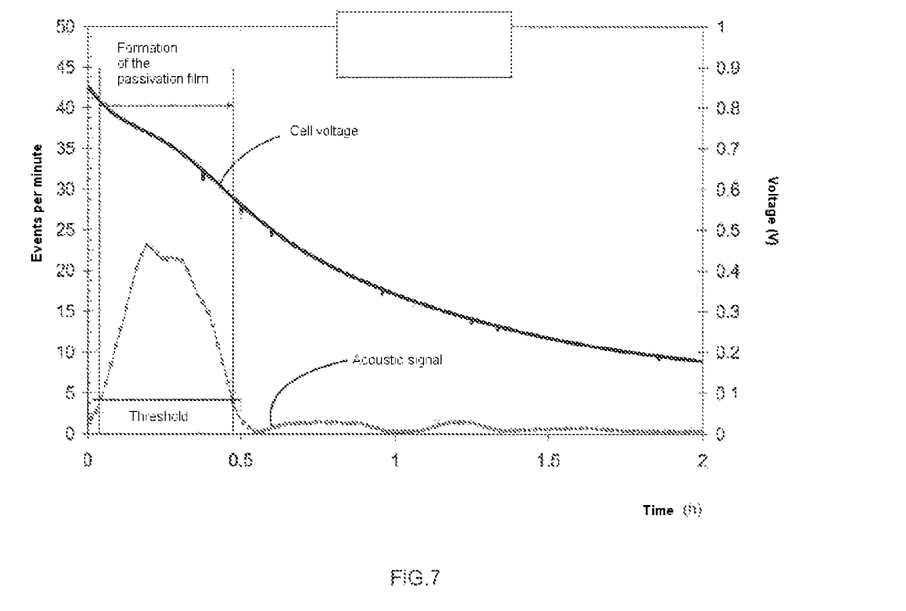

For example, it is possible to use, as a criterion for detecting the formation of a passivation film or the first storage of lithium, the number of acoustic events detected. In particular, it can be considered that there is detection as soon as a number of acoustic events per time interval passes an upward threshold, for example varies by more than 5% relative to a number of acoustic events per given time interval. This is illustrated by FIGS. 6 and 7. The acoustic signal curve from FIG. 7 in fact represents the derivative of the number of events curve of the acoustic signal from FIG. 6. It can also be considered that there is detection when the derivative of the number of events per unit time exceeds a threshold value, for example 5 acoustic events per minute.

Figure 8:
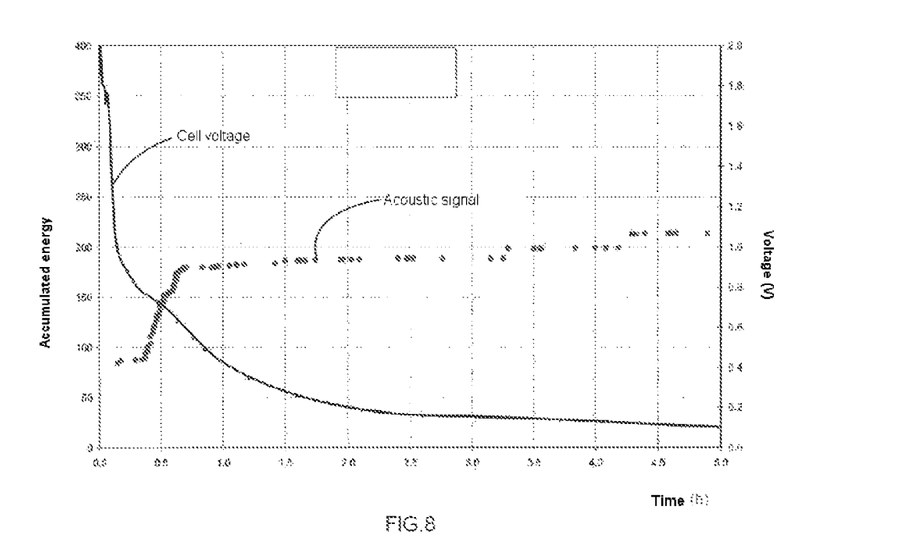
Figure 9:
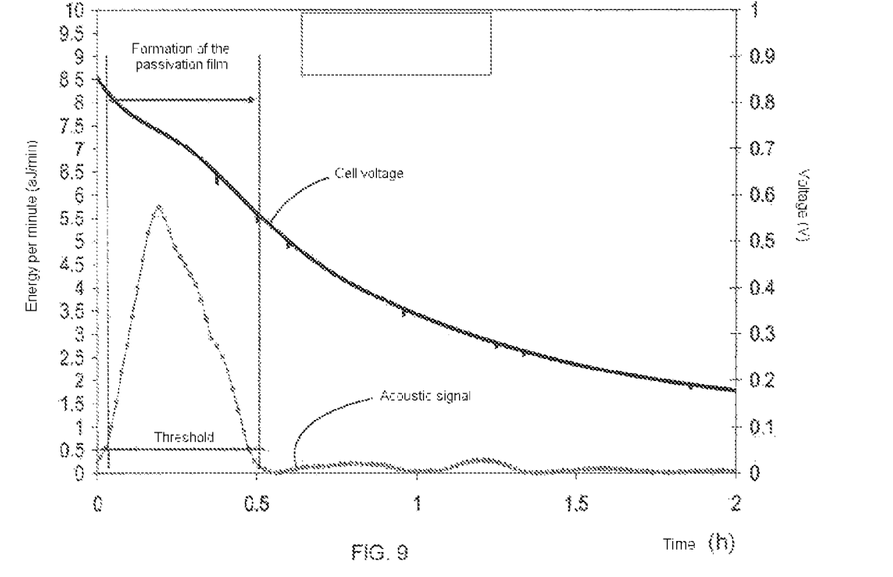

In the same way, it is possible to use the accumulated energy and its derivative, the changes in which are represented in FIGS. 8 and 9. In particular, it can be considered that there is detection as soon as an accumulated energy per time interval passes an upward threshold, for example varies by more than 5% relative to an accumulated energy per given time interval. This is illustrated by FIGS. 8 and 9. The acoustic signal curve from FIG. 9 in fact represents the derivative of the accumulated energy curve of the acoustic signal from FIG. 8. It can also be considered that there is detection when the derivative of the accumulated energy exceeds a threshold value, for example $0.5 \times 10^{-18}$ J/min.

Generally, it is possible to use any combination of the six parameters mentioned above. In particular, any threshold crossing, in particular upward or downward, of a parameter can be considered to be a detection. Notably, any increase of more than 5% of a parameter can be considered to be a detection. The threshold is advantageously defined with respect to a level of a parameter or of a combination of parameters that characterizes a background noise determined at the start of the charging of the cell or of the battery, i.e. before the start of the formation of the passivation film and/or before the start of the first storage of lithium.

A first embodiment of a method for charging an electrochemical cell or a battery 1 according to the invention is described below. It makes it possible in particular to carry out the first charging of an electrochemical cell or of a battery of Li-ion type.

In a first step, the monitoring method mentioned previously is implemented.

Simultaneously, in a second step, the electrochemical cell or the battery is charged, in particular by operating the charging device 11. The charging or the operation of the charging device is dependent on the detection or absence of detection:
  of the formation of a passivation film on an electrode of
    the electrochemical cell or of the battery; and/or
  of the first storage of lithium in an electrode of the
    electrochemical cell or of the battery,
carried out in the first step.

Advantageously, in a first charging phase, the electrochemical cell or the battery is charged with a first charging current before detecting the formation of the passivation film on an electrode of the electrochemical cell or of the battery and/or before detecting the first storage of lithium in an electrode, then, in a second charging phase, the electrochemical cell or the battery is charged with a second charging current when the formation of a passivation film on an electrode of the electrochemical cell or of the battery is detected and/or when the first storage of lithium in an electrode is detected.

The intensity of the second current may be lower than the intensity of the first current, in particular the intensity of the second current is less than 75% of the intensity of the first current, or even less than 50% of the intensity of the first current.

Finally, in a third charging phase, the electrochemical cell or the battery is charged with a third charging current when the formation of a passivation film on an electrode of the electrochemical cell or of the battery is no longer detected and/or when the first storage of lithium in an electrode is no longer detected.

The intensity of the second current is lower than the intensity of the third current, in particular the intensity of the second current is less than 75% of the intensity of the third current, or even less than 50% of the intensity of the third current.

Preferably, the intensities of the first and third currents are equal or are substantially equal.

Figure 10:
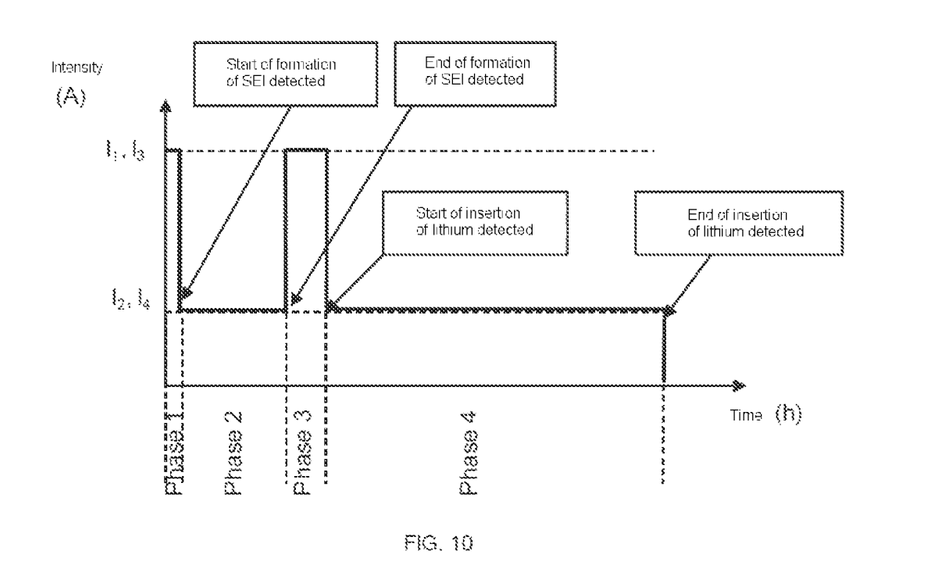
FIG. 10 is a graph of the temporal change in the intensity of a current for charging a battery obtained by the implementation of a charging method according to the invention.

A second embodiment of the method for charging an electrochemical cell or a battery 1 according to the invention is described below with reference to FIG. 10. It makes it possible in particular to carry out the first charging of an electrochemical cell or of a battery of Li-ion type.

In a first step, the monitoring method mentioned previously is implemented.

Simultaneously, in a second step, the electrochemical cell or the battery is charged, in particular by operating the charging device 11. The charging or the operation of the charging device is dependent on the detection or absence of detection:
  of the formation of a passivation film on an electrode of
    the electrochemical cell or of the battery; and/or
  of the first storage of lithium in an electrode of the
    electrochemical cell or of the battery,
carried out in the first step.

Advantageously, in a first charging phase (Phase 1), the electrochemical cell or the battery is charged with a first charging current before detecting the formation of the passivation film on an electrode of the electrochemical cell or of the battery, then, in a second charging phase (Phase 2), the electrochemical cell or the battery is charged with a second charging current when the formation of a passivation film on an electrode of the electrochemical cell or of the battery is detected.

The intensity of the second current may be lower than the intensity of the first current, in particular the intensity of the second current is less than 75% of the intensity of the first current, or even less than 50% of the intensity of the first current.

In a third charging phase (Phase 3), the electrochemical cell or the battery is charged with a third charging current when the formation of a passivation film on an electrode of the electrochemical cell or of the battery is no longer detected, until the first storage of lithium in an electrode is detected. Then, in a fourth charging phase (Phase 4), the electrochemical cell or the battery is charged with a fourth charging current when the first storage of lithium in an electrode is detected.

The intensity of the fourth current may be lower than the intensity of the third current, in particular the intensity of the fourth current is less than 75% of the intensity of the first current, or even less than 50% of the intensity of the third current. The intensities of the first and third currents may be equal. The intensities of the second and fourth currents may be equal.

Preferably, the intensities of the first and third currents are equal or are substantially equal.

The durations of the phenomena of formation of the film and/or of first storage of lithium are short compared with the total duration of the charging (about a tenth of the total duration of the charging). The saving in charging time comes from the possibility of accelerating the charging, with a higher charging current, outside the phases where the phenomena previously mentioned occur. Thus, a battery usually charged in 20 hours can be charged in 10 hours. During the phases where the phenomena previously mentioned occur, the intensity of the charging current is reduced in order to obtain a cell structure of good quality, in particular of optimised capacity.

A first embodiment of a method for manufacturing an electrochemical cell or a battery 1 according to the invention is described below. It makes it possible in particular to produce an electrochemical cell or a battery of Li-ion type.

The manufacturing method comprises a step of implementing the charging method described previously.

Finally, the invention also relates to an electrochemical cell or battery 1 obtained by the implementation of the manufacturing method described previously.

The method according to the invention makes it possible to manage the formation of the passivation or SEI film which occurs on the negative electrode during the first charging of the electrochemical cell or during the first discharging of the graphite-lithium half-cell. This management is carried out with the aid of the acoustic emissions produced in the electrochemical cell. Such a method is advantageous because it is non-intrusive. Indeed, an acoustic signal sensor may be simply positioned on the electrochemical cell, in particular on one of the faces of the electrochemical cell. As a consequence, it is possible to monitor the first charging of the battery, and therefore the formation of the SEI film without modifying the steps of producing or manufacturing the battery. The implementation of the method is therefore simple and inexpensive. Furthermore, it is possible to detect the acoustic emissions in a reliable manner. Indeed, even a low acoustic activity due to electrochemical reactions inside the cell can be detected.

Due to the fact that the electrochemical reactions are distinctive during the first charging of the cell or of the battery, during the latter, distinctive acoustic emissions are produced that are different from the acoustic emissions produced during the subsequent steps of charging or discharging the cell or the battery. In particular, it may be detected at what moment the reaction for formation of the SEI film and/or the first storage of the lithium ions in the electrode occurs. Thus, it is possible to use particular charging conditions at these moments. Additionally, other charging conditions are advantageously used outside of these moments. Consequently, it is possible to substantially improve the quality of the cells or batteries produced without however increasing the duration of the method for manufacturing the batteries or the cells.

During tests, signals representative of the acoustic emissions were recorded and are represented in FIGS. 5 to 9. These recordings were made with a monitoring system comprising a preamplifier having a gain of 60 dB and a band-pass filter of 100 kHz-1 MHz. A threshold was set at 24 dB: it is beyond this threshold that it is considered that there is an acoustic emission. The intensity of the charging and discharging currents was set so that the cell or the battery would be completely charged or completely discharged in 20 hours.

Figure 5:
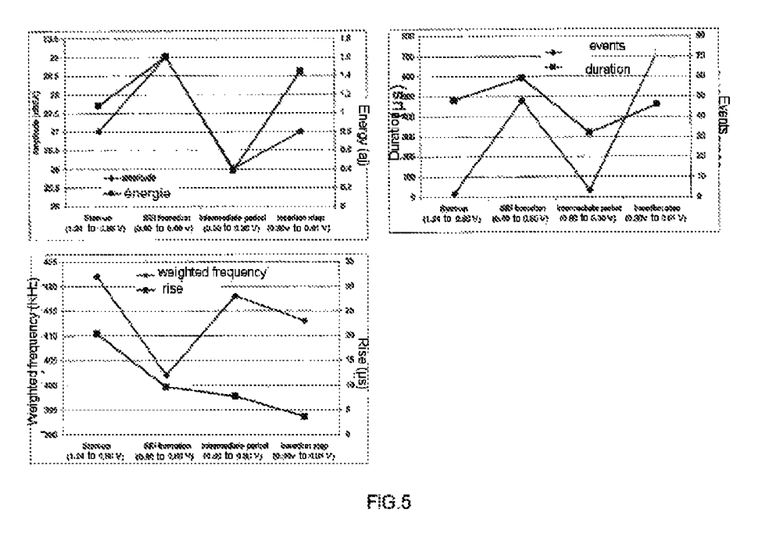
FIGS. 5 to 9 are graphs illustrating the correlations that exist between physical or chemical phenomena that occur in a cell or in a battery and acoustic emissions produced in this cell or this battery.

During a first discharging at constant intensity, during which the SEI film is formed when the potential is around 0.8 V to 0.6 V, and during which a first storage of lithium between the planes or strata of the graphite electrode takes place when the potential is around 0.2 V to 0.01 V, numerous acoustic emissions can be detected.

As represented in FIG. 5, the phases of formation of the SEI film and of first storage of lithium in the graphite electrode on the one hand and the acoustic emissions (also referred to as events in these figures) may be correlated. The phase of formation of the SEI film can therefore be detected by analysis of the acoustic emissions.

As represented in FIGS. 6 to 9, the changes in the parameters of the acoustic emissions during the discharging show that the phase of formation of the SEI film can, from its start to its end, be detected and therefore consequently be managed.

Li-ion batteries exist that have a lithium insertion material. In this case, the phenomenon of formation of the passivation film and the phenomenon of lithium insertion appear one after the other. There is firstly the phenomenon of formation of the film, then the phenomenon of lithium insertion or storage. It is possible to monitor only the first hold induced by the phenomenon of formation of the film, or to monitor the hold induced by the phenomena of formation of the film and of lithium insertion.

Li-ion batteries also exist that have a lithium conversion material. In this case, only the phenomenon of lithium insertion exists. There is no film formation phenomenon. It is possible here to monitor the phenomenon of lithium storage, i.e. of change in the chemical structure of the material.

The invention claimed is:

1. A method for initially charging an electrochemical cell or a battery, comprising:
   monitoring the electrochemical cell or the battery during the initial charging, wherein the monitoring comprises:
      detecting acoustic signals from the electrochemical cell or the battery; and
      determining, based upon the detected acoustic signals:
         that a passivation film on an electrode of the electrochemical cell or the battery has not been formed; and
         that a passivation film on the electrode of the electrochemical cell or the battery is being formed or has formed; and
   initially charging the electrochemical cell or the battery based upon the monitoring, wherein initially charging comprises:
      charging the electrochemical cell or the battery with a first charging current before formation of a passivation film on the electrode of the electrochemical cell or the battery based upon the determination that no passivation film has been formed; and
      charging the electrochemical cell or the battery with a second charging current based upon the determination that the passivation film is being formed or has formed;
   wherein a mean intensity of the first charging current is greater than a mean intensity of the second charging current,
   wherein the electrochemical cell or battery is a Lithium-ion (Li-ion) electrochemical cell or Li-ion battery.

2. The method of charging according to claim 1, comprising:
   determining, based upon the acoustic signals, that the passivation film has completely formed on the electrode of the electrochemical cell or of the battery; and
   charging the electrochemical cell or a battery with a third charging current based upon the determination that the passivation film has completely formed,
   wherein a mean intensity of the third charging current is greater than the mean intensity of the second charging current.

3. The method of charging according to claim 2, wherein the mean intensity of the third charging current is equal to or is substantially equal to the mean intensity of the first charging current.

4. The method of charging according to claim 1, wherein the mean intensity of the second charging current is less than 75% of the mean intensity of the first charging current.

5. The charging method of claim 4, wherein the mean intensity of the second charging current less than 50% of the mean intensity of the first charging current.

6. The method of charging according to claim 2, wherein the mean intensity of the second charging current is less than 75% of the mean intensity of the third charging current.

7. The method of charging according to claim 6, wherein the mean intensity of the second charging current less than 50% of the mean intensity of the third charging current.

8. The method of charging according to claim 1, wherein detection of the acoustic signals is based on at least one parameter selected from the group consisting of:
a number of acoustic events, an amplitude of an acoustic event, an energy of an acoustic event, a rise or rise time of an acoustic event, a frequency of acoustic events, and a duration of an acoustic event.

9. The method of charging according to claim 1, wherein the electrode is a carbonaceous material.

10. The method of charging according to claim 9, wherein the passivation film is a Solid Electrolyte Interface (SEI) film.

11. The method of charging according to claim 9, wherein the carbonaceous material is graphite.

12. The method of charging according to claim 1, wherein the step of determining, based upon the detected acoustic signals, further comprises:
determining the start of formation of the passivation film based on detection of a first acoustic signal from the electrochemical cell or battery; and
determining the completion of formation of the passivation film based on detection of a second acoustic signal from the electrochemical cell or battery.

13. A method for initially charging a Lithium-ion (Li-ion) electrochemical cell or a Li-ion battery, comprising:
monitoring the electrochemical cell or the battery during the initial charging, wherein the monitoring comprises:
detecting acoustic signals from the electrochemical cell or the battery; and
determining, based upon the detected acoustic signals:
that lithium is not being stored in a graphite electrode of the electrochemical cell or the battery;
that lithium is being stored in the graphite electrode of the electrochemical cell or the battery; and
the start and completion of lithium being stored in the graphite electrode of the electrochemical cell or the battery; and
initially charging the electrochemical cell or the battery based upon the monitoring, wherein initially charging comprises:
charging the electrochemical cell or the battery with a first charging current before lithium is stored in the Li-ion electrochemical cell or the Li-ion battery based upon the determination that lithium is not being stored in the graphite electrode of the electrochemical cell or the battery; and
charging the electrochemical cell or the battery with a second charging current based upon the determination that lithium is being stored in the graphite electrode of the electrochemical cell or the battery;
wherein a mean intensity of the first charging current is greater than a mean intensity of the second charging current.

14. The method of charging according to claim 13, comprising:
charging the electrochemical cell or the battery with a third charging current based upon the determination of the completion of lithium being stored in the graphite electrode of the electrochemical cell or the battery,
wherein a mean intensity of the third charging current is greater than the mean intensity of the second charging current.

15. The method of charging according to claim 14, wherein the mean intensity of the third charging current is equal to or is substantially equal to the mean intensity of the first charging current.

16. The method of charging according to claim 14, wherein the mean intensity of the second charging current is less than 75% of the mean intensity of the third charging current.

17. The method of charging according to claim 16, wherein the mean intensity of the second charging current less than 50% of the mean intensity of the third charging current.

18. The method of charging according to claim 13, wherein the mean intensity of the second charging current is less than 75% of the mean intensity of the first charging current.

19. The charging method of claim 18, wherein the mean intensity of the second charging current less than 50% of the mean intensity of the first charging current.

20. The method of charging according to claim 13, wherein detection of the acoustic signals is based on at least one parameter selected from the group consisting of:
a number of acoustic events, an amplitude of an acoustic event, an energy of an acoustic event, a rise or rise time of an acoustic event, a frequency of acoustic events, and a duration of an acoustic event.

21. The method of charging according to claim 13, wherein the step of determining, based upon the detected acoustic signals, the start and completion of lithium being stored in the graphite electrode of the electrochemical cell or the battery, comprises:
determining the start of storage of lithium based on detection of a first acoustic signal from the Li-ion electrochemical cell or Li-ion battery; and
determining the completion of storage of lithium based on detection of a second acoustic signal from the Li-ion electrochemical cell or Li-ion battery.

* * * * *

UNITED STATES PATENT AND TRADEMARK OFFICE
CERTIFICATE OF CORRECTION

PATENT NO. : 9,673,650 B2
APPLICATION NO. : 14/114573
DATED : June 6, 2017
INVENTOR(S) : Sylvie Genies et al.

It is certified that error appears in the above-identified patent and that said Letters Patent is hereby corrected as shown below:

In the Claims

Claim 5, Line 2 (Column 11, Line 5), the word "is" is missing and should read:
"intensity of the second charging current is less than 50% of the";

Claim 7, Line 2 (Column 11, Line 11), the word "is" is missing and should read:
"the mean intensity of the second charging current is less than";

Claim 17, Line 2 (Column 12, Line 28), the word "is" is missing and should read:
"wherein the mean intensity of the second charging current is";

Claim 19, Line 2 (Column 12, Line 36), the word "is" is missing and should read:
"intensity of the second charging current is less than 50% of the".

Signed and Sealed this
Eighteenth Day of June, 2019

Andrei Iancu
*Director of the United States Patent and Trademark Office*